(12) United States Patent
Tadeparthy et al.

(10) Patent No.: US 7,733,180 B1
(45) Date of Patent: Jun. 8, 2010

(54) AMPLIFIER FOR DRIVING EXTERNAL CAPACITIVE LOADS

(75) Inventors: Preetam Charan Anand Tadeparthy, Bangalore (IN); Vikram Gakhar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 13 days.

(21) Appl. No.: 12/323,813

(22) Filed: Nov. 26, 2008

(51) Int. Cl.
*H03F 3/45* (2006.01)
(52) U.S. Cl. .................... 330/260; 330/302; 330/310
(58) Field of Classification Search .......... 330/260, 330/302, 310
See application file for complete search history.

(56) References Cited

U.S. PATENT DOCUMENTS

| | | | | |
|---|---|---|---|---|
| 5,631,598 | A * | 5/1997 | Miranda et al. | 327/540 |
| 6,246,221 | B1 * | 6/2001 | Xi | 323/280 |
| 6,259,238 | B1 * | 7/2001 | Hastings | 323/280 |
| 6,300,749 | B1 * | 10/2001 | Castelli et al. | 323/273 |
| 6,373,233 | B2 | 4/2002 | Bakker et al. | |
| 6,518,737 | B1 | 2/2003 | Stanescu et al. | |
| 6,700,360 | B2 * | 3/2004 | Biagi et al. | 323/280 |
| 6,960,907 | B2 * | 11/2005 | Poss | 323/316 |
| 6,977,490 | B1 | 12/2005 | Zhang et al. | |
| 7,235,959 | B2 | 6/2007 | Sicard | |
| 7,432,693 | B2 | 10/2008 | Enjalbert | |
| 7,589,507 | B2 * | 9/2009 | Mandal | 323/273 |
| 2007/0188228 | A1 | 8/2007 | Renous | |
| 2007/0241731 | A1 | 10/2007 | Van Ettinger | |

* cited by examiner

*Primary Examiner*—Patricia Nguyen
(74) *Attorney, Agent, or Firm*—John J. Patti; Wade J. Brady, III; Frederick J. Telecky, Jr.

(57) ABSTRACT

An apparatus having a zero-pole that is dependant on an equivalent series resistance (ESR) and a load is provided. The apparatus comprises an amplifier stage that receives a first input voltage and a bias voltage, an intermediate stage that is coupled to the output node of the amplifier stage (where the intermediate stage outputs an intermediate voltage to an intermediate node), a first capacitor coupled between at least one of the internal transistors at an internal node and the intermediate node, a power transistor coupled between a second input voltage and the intermediate node, a second capacitor coupled between the internal node and the power transistor, and a feedback stage coupled to the intermediate node and to the amplifier stage. The amplifier stage also has an output node and includes a plurality of internal transistors. The second capacitor provides a third input voltage to the power transistor, and the ratio of the capacitance of the first capacitor to the capacitance of the second capacitor controls the position of the zero-pole. Additionally, the feedback stage is adapted to output an output voltage to a load, and wherein the feedback stage provides a feedback voltage to the amplifier stage.

17 Claims, 2 Drawing Sheets

US 7,733,180 B1

AMPLIFIER FOR DRIVING EXTERNAL CAPACITIVE LOADS

TECHNICAL FIELD

The invention relates generally to an amplifier and, more particularly, to an amplifier having greater stability for driving external capacitive loads.

BACKGROUND

Wide band amplifiers typically suffer from multi-pole response due to their topology. A very standard technique to improve stability in differential amplifiers is to intentionally add pole zero pairs and improve phase margin. Some examples of conventional circuits can be seen in U.S. Pat. Nos. 6,518,737; 7,432,693; and 7,235,959 and U.S. Patent Pre-Grant Pub. Nos. 2007/0241731 and 2006/0273771.

SUMMARY

An embodiment of the present invention, accordingly, provides an apparatus having a zero-pole that is dependant on an equivalent series resistance (ESR) and a load. The apparatus comprises an amplifier stage that receives a first input voltage and a bias voltage, wherein the amplifier stage has an output node, and wherein the amplifier stage includes a plurality of internal transistors; an intermediate stage that is coupled to the output node of the amplifier stage, wherein the intermediate stage outputs an intermediate voltage to an intermediate node; a first capacitor coupled between at least one of the internal transistors at an internal node and the intermediate node; a power transistor coupled between a second input voltage and the intermediate node; a second capacitor coupled between the internal node and the power transistor, wherein the second capacitor provides a third input voltage to the power transistor, wherein the ratio of the capacitance of the first capacitor to the capacitance of the second capacitor controls the position of the zero-pole; and a feedback stage coupled to the intermediate node and to the amplifier stage, wherein the feedback stage is adapted to output an output voltage to a load, and wherein the feedback stage provides a feedback voltage to the amplifier stage.

In accordance with another embodiment of the present invention, the amplifier stage further comprises a plurality of differential amplifiers.

In accordance with another embodiment of the present invention, the amplifier stage further comprises a first differential amplifier that receives the first input voltage and the feedback voltage; and a second differential amplifier that receives a plurality of inputs from the first differential amplifier, wherein the second differential amplifier includes the internal node.

In accordance with another embodiment of the present invention, the intermediate stage further comprises a PMOS transistor coupled to the bias voltage at its drain and the output node of the amplifier stage at its gate; and a resistor coupled between the source of the PMOS transistor and the intermediate node.

In accordance with another embodiment of the present invention, the feedback stage further comprises a feedback node coupled to the amplifier stage; an impedance coupled between the intermediate node and the output node; a voltage divider coupled to the output node to the feedback node; a third capacitor coupled between the intermediate node and the feedback node; and a fourth capacitor coupled between the output node and the feedback node.

In accordance with another embodiment of the present invention, the second capacitor is about 150 fF.

In accordance with another embodiment of the present invention, the first capacitor is about 10 pF.

In accordance with another embodiment of the present invention, an apparatus having a zero-pole that is dependant on an ESR and a load. The apparatus comprises an amplifier stage that receives a first input voltage and a bias voltage, wherein the amplifier stage includes: a first current source coupled to the bias voltage; a first FET coupled at its drain to the first current source; a second FET coupled at its drain to the first current source; a second current source coupled to the bias voltage; a third FET coupled to the second current source at its drain and to the source of the first transistor at its gate; a fourth FET coupled to the second current source at its drain and to the source of the second transistor at its gate; a current mirror coupled to the bias voltage; and a transistor coupled to the current mirror at an output node and coupled to the source of the fourth FET at an internal node; an intermediate stage that is coupled to the output node of the amplifier stage, wherein the intermediate stage outputs an intermediate voltage to an intermediate node; a first capacitor coupled between at least one of the internal transistors at an internal node and the intermediate node; a power transistor coupled between a second input voltage and the intermediate node; a second capacitor coupled between the internal node and the power transistor, wherein the second capacitor provides a third input voltage to the power transistor, wherein the ratio of the capacitance of the first capacitor to the capacitance of the second capacitor controls the position of the zero-pole; and a feedback stage coupled to the intermediate node and to the amplifier stage, wherein the feedback stage is adapted to output an output voltage to a load, and wherein the feedback stage provides a feedback voltage to the gate of the first FET.

In accordance with another embodiment of the present invention, the amplifier stage further comprises a fifth FET coupled to the source of the third FET at its drain; and a sixth FET coupled to internal node at its drain, wherein the gate of the fifth FET is coupled to the gate of the sixth FET.

In accordance with another embodiment of the present invention, the intermediate stage further comprises a PMOS transistor coupled to the bias voltage at its drain and the output node of the amplifier stage at its gate; and a resistor coupled between the source of the PMOS transistor and the intermediate node.

In accordance with another embodiment of the present invention, an apparatus having a zero-pole that is dependant on an ESR and a load. The apparatus comprises an amplifier stage that receives a first input voltage and a bias voltage, wherein the amplifier stage includes: a first current source coupled to the bias voltage; a first FET coupled at its drain to the first current source; a second FET coupled at its drain to the first current source; a second current source coupled to the bias voltage; a third FET coupled to the second current source at its drain and to the source of the first transistor at its gate; a fourth FET coupled to the second current source at its drain and to the source of the second transistor at its gate; a current mirror coupled to the bias voltage; a transistor coupled to the current mirror at an output node and coupled to the source of the fourth FET at an internal node; a fifth FET coupled to the source of the third FET at its drain; and a sixth FET coupled to internal node at its drain, wherein the gate of the fifth FET is coupled to the gate of the sixth FET; an intermediate stage that is coupled to the output node of the amplifier stage, wherein the intermediate stage outputs an intermediate voltage to an intermediate node; a first capacitor coupled between at least one of the internal transistors at an internal node and the intermediate node; a power transistor coupled between a second input voltage and the intermediate node; a second capacitor coupled between the intermediate node and the power transistor, wherein the second capacitor provides a third input voltage to the power transistor, wherein the ratio of the capacitance of the first capacitor to the capacitance of the second capacitor controls the position of the zero-pole; and a feedback stage coupled to the intermediate node and to the amplifier stage, wherein the feedback stage is adapted to output an output voltage to a load, and wherein the feedback stage includes: a feedback node coupled to the gate of the first FET; an impedance coupled between the intermediate node and the output node; a voltage divider coupled to the output node to the feedback node; a third capacitor coupled between the intermediate node and the feedback node; and a fourth capacitor coupled between the output node and the feedback node.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
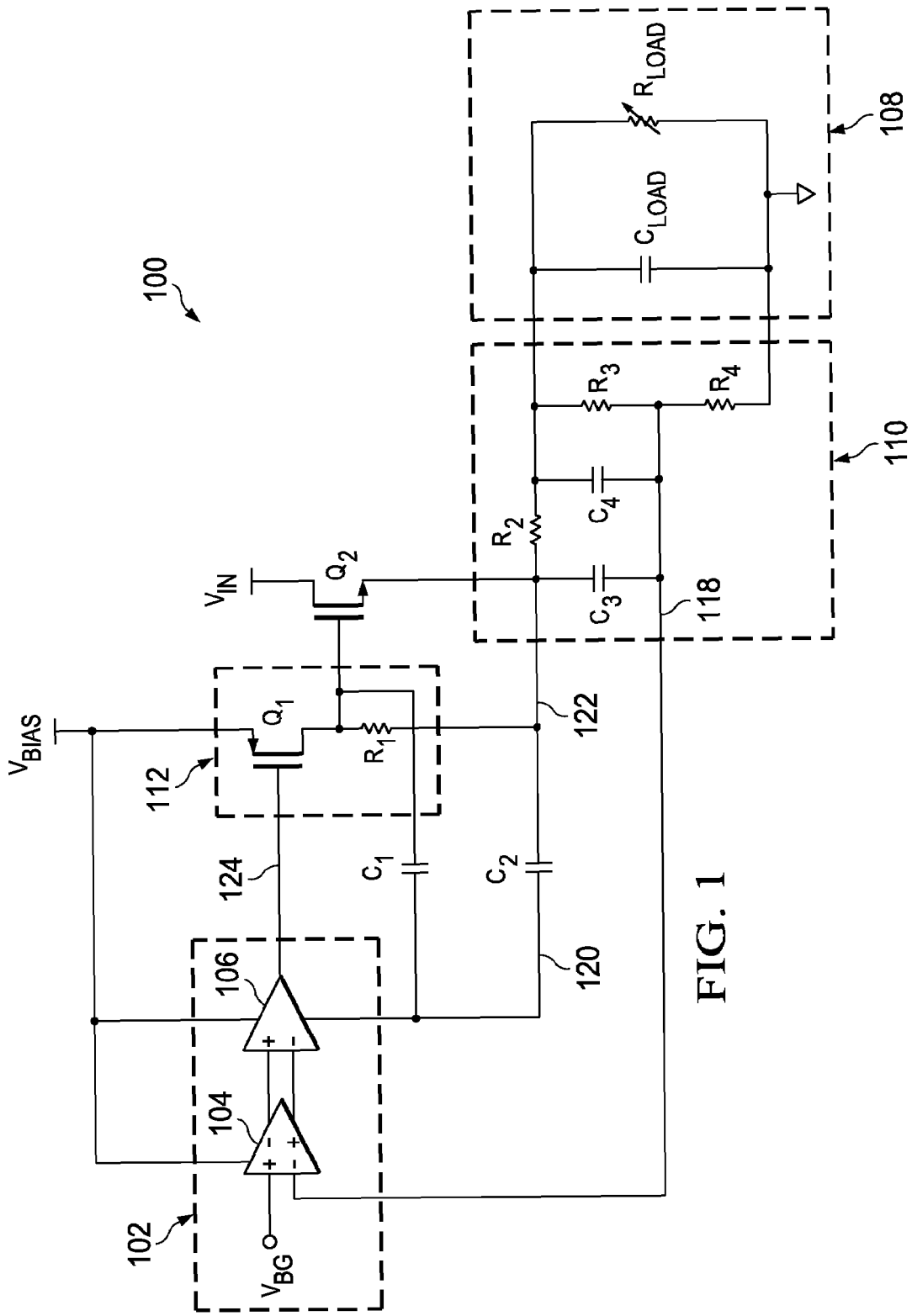
FIG. 1 is a block diagram of the amplifier in accordance with a preferred embodiment of the present invention.

Refer now to the drawings wherein depicted elements are, for the sake of clarity, not necessarily shown to scale and wherein like or similar elements are designated by the same reference numeral through the several views.

Figure 2:
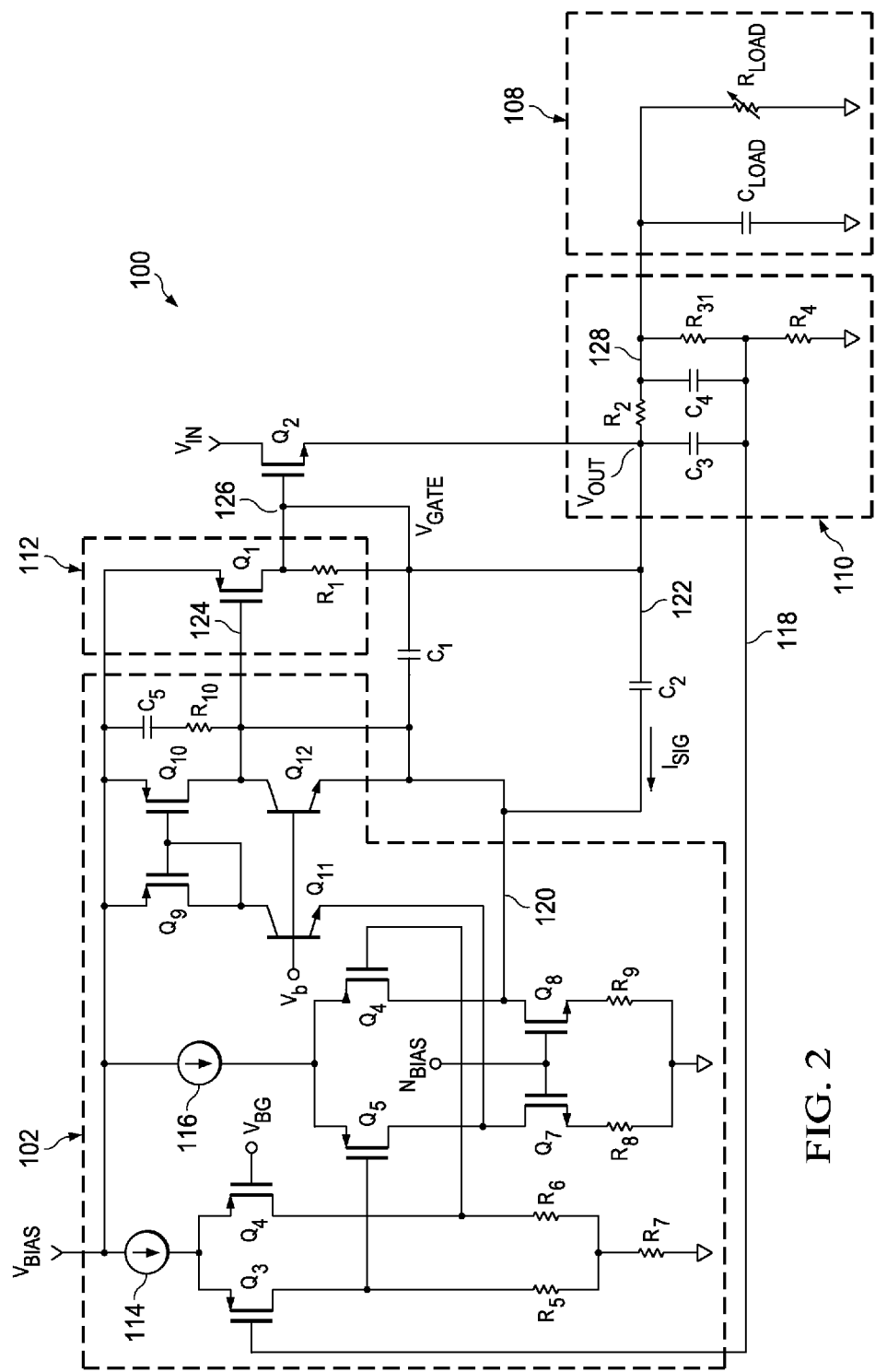
FIG. 2 is a more detailed block diagram of the amplifier of FIG. 1.

Referring now to FIGS. 1 and 2 of the drawings, the reference numeral 100 generally depicts an amplifier in accordance with a preferred embodiment of the present invention. The amplifier 100 (which is coupled to load 108) is generally comprised of an amplifier stage 102, an intermediate stage 112, feedback stage 110.

As can be seen in FIG. 1, the amplifier stage 102 is generally comprised of a pair of differential amplifiers 104 and 106 coupled to one another in a cascade arrangement. Preferably, the first differential amplifier receives a first input voltage $V_{BG}$ and a feedback voltage through feedback node 118. The outputs of the first differential amplifier are inputs to the second differential amplifier which outputs an output voltage to the intermediate stage at output node 124. Additionally, capacitors $C_1$ and $C_2$ are coupled to an internal node 120 within the second differential amplifier 106. Generally, capacitors $C_1$ and $C_2$ operate as sense elements and provide a voltage to the node between transistors $Q_1$ and $Q_2$ (which are preferably a PMOS FET and an NMOS FET, respectively) and a voltage to intermediate node 122.

Turning to FIG. 2, the amplifier stage 102 can be seen in greater detail. The first portion of the amplifier stage 102 is a portion of the first differential amplifier 102. Preferably, this first portion is comprised of a current source 114, transistors $Q_3$ and $Q_4$, and resistor $R_5$, $R_6$, and $R_7$. In this first portion, the current source 114 is coupled to a bias voltage $V_{BIAS}$ and is coupled to the drains of transistors $Q_3$ and $Q_4$ (which are preferably PMOS FETs). The sources of transistors $Q_3$ and $Q_4$ are the coupled to resistors $R_5$ and $R_6$, respectively, and each of resistors $R_5$ and $R_6$ is coupled to resistor $R_7$. Additionally, the control electrode of transistor $Q_4$ receives the first input voltage $V_{BG}$ while transistor $Q_3$ receives a feedback signal through feedback node 118 from the feedback stage 110.

The second portion of the amplifier stage 102 is a portion of the differential amplifier 106. Preferably, this second portion is comprised of a current source 116, transistors $Q_5$, $Q_6$, $Q_7$, and $Q_8$, and resistor $R_8$ and $R_9$. In this second portion, the current source 116 is coupled to the bias voltage $V_{BIAS}$ and is coupled to the drains of transistors $Q_5$ and $Q_6$ (which are preferably PMOS FETs). The sources of transistors $Q_3$ and $Q_4$ are the coupled to the drains of transistors $Q_7$ and $Q_8$, which are preferably NMOS FETs and which are biased at their gates by a bias voltage $N_{BIAS}$. The sources of transistors $Q_7$ and $Q_8$ are coupled to resistors $R_8$ and $R_9$, respectively. Additionally, the control electrode of transistor $Q_5$ is coupled to the source of transistor $Q_3$ while transistor $Q_6$ is coupled to the an electrode of transistor $Q_4$.

The third portion of the amplifier stage is portion of the differential amplifier 106. Preferably, this third portion is comprised of a current mirror $Q_9$ and $Q_{10}$, capacitor $C_5$, resistor $R_{10}$, and transistors $Q_{11}$, and $Q_{12}$. In this third portion, current mirror $Q_9$ and $Q_{10}$ (which are preferably PMOS FETs) is coupled to the bias voltage $V_{BIAS}$. Transistor $Q_{11}$ is coupled between the source of transistor $Q_9$ and the source of transistor $Q_5$ while transistor $Q_{12}$ is coupled to the source of transistor $Q_{10}$ and is coupled to the source of transistor $Q_6$ at internal node 120. Each of these transistor $Q_{11}$ and $Q_{12}$ (which are preferably bipolar NPN transistors) receives an input voltage $V_b$ at its respective control node. Additionally, capacitor $C_5$ and resistor $R_{10}$ are coupled between the bias voltage $V_{BIAS}$ and the source of transistor $Q_{10}$ (at the output node 124).

As can be seen in both FIGS. 1 and 2, the intermediate stage 112 is generally comprised of transistor $Q_1$ and resistor $R_1$. Transistor $Q_1$ is coupled at one of its electrodes to the bias voltage $V_{BIAS}$, its control electrode to the output node 124, and to resistor $R_1$ (at control node 126) at its other electrode. Resistor R1 is then coupled between the control node 126 and the intermediate node 122. Additionally, power transistor $Q_2$ (preferably an NMOS FET) is coupled at its control electrode to the control node 126, and is coupled to an input voltage $V_{IN}$ and the feedback circuit 110 at its other electrodes.

Also, as can be seen in FIGS. 1 and 2, the feedback circuit 110 is generally comprised of resistor $R_2$, capacitors $C_3$ and $C_4$, and voltage divider $R_3$ and $R_4$. $R_2$ is generally described as the effective series resistance or ESR resistance, which is coupled to the intermediate node 122 and the load 108 (which is generally comprised of capacitor $C_{LOAD}$ and resistor $R_{LOAD}$) at output node 128. Capacitor $C_3$ is coupled between the intermediate node 122 and the feedback node 118 while capacitor is coupled between the output node 128 and the feedback node 118. Additionally, the voltage divider $R_3$ and $R_4$ is coupled between the output node 128 and ground, and the feedback node 118 is coupled to the voltage divider between resistors $R_3$ and $R_4$.

One difference between circuit 100 and other amplifier circuits is the use of capacitors $C_1$ and $C_2$. Capacitor $C_1$ (which is preferably about 150 fF) is coupled between internal node 120 and control node 126, and capacitor $C_2$ (which is preferably about 10 pF) is coupled between internal node 120 and intermediate node 122. One reason for employing these capacitors is to control the position of the zero-pole in the transfer function. In the s-domain, the output voltage $V_{OUT}$ at intermediate node 122 would be as follows:

$$V_{GATE} = V_{OUT}\left(\frac{1 + sR_{EFF}C_{LOAD}}{1 + sR_2 C_{LOAD}}\right) \quad (1)$$

The signal current ISIG would also be:

$$I_{SIG} = sC_1 V_{GATE} + sC_2 V_{OUT} = sV_{OUT}\left[C_1\left(\frac{1+sR_{EFF}C_{LOAD}}{1+sR_2 C_{LOAD}}\right) + C_2\right] = \quad (2)$$
$$sC_2 V_{OUT}\left[\left(\frac{C_1}{C_2}\right)\left(\frac{1+sR_{EFF}C_{LOAD}}{1+sR_2 C_{LOAD}}\right) + 1\right]$$

Equation 2 can then be simplified as follows:

$$\frac{I_{SIG}}{V_{OUT}} = sC_2\left[\frac{\left(\frac{C_1}{C_2}\right)(1+sR_{EFF}C_{LOAD}) + 1 + sR_2 C_{LOAD}}{1+sR_2 C_{LOAD}}\right] = \quad (3)$$
$$sC_2\left[\frac{\left(\frac{C_1}{C_2}\right) + sC_{LOAD}\left(R_{EFF}\left(\frac{C_1}{C_2}\right) + R_2\right) + 1}{1+sR_2 C_{LOAD}}\right]$$

It is, therefore, clear from Equation (3) that the signal current $I_{SIG}$ has a zero which is not only dependent on the $R_2$ (ESR) but also on the value of the load resistance, and the ratio of capacitor $C_1$ to capacitor $C_2$ controls the location of zero-pole with respect to the pole created by capacitor $C_{load}$ and the effective resistance $R_{eff}$ of the feedback stage 110 and load 108. The configuration of amplifier 100, thus, makes it possible to have a zero-pole that tracks the output pole.

Preferably, the design methodology employed can generate zeros in the transfer function, improving the phase loss. In this design methodology, several assumptions are made: there are two (possibly more) nodes with different gains and phase relations; and the two nodes are algebraically related to one another. With these assumptions, the following formula an be written:

$$\frac{V_1}{V_x} = A_0 \left[\frac{\sum_{i=0}^{N} a_i S^i}{\sum_{i=0}^{N} b_i S^i}\right] \quad (4)$$

-continued $$\frac{V_2}{V_x} = B_0 \left[\frac{\sum_{i=0}^{N} c_i S^i}{\sum_{i=0}^{N} d_i S^i}\right] \quad (5)$$

$$V_1 = f(V_2) \quad (6)$$

Equations can then be incorporated as follows:

$$I_{SIG} = C_1 V_1 + C_2 V_2 = C_1 V_x A_0 \left[\frac{\sum_{i=0}^{N} a_i S^i}{\sum_{i=0}^{N} b_i S^i}\right] + C_2 f\left(V_x A_0 \left[\frac{\sum_{i=0}^{N} a_i S^i}{\sum_{i=0}^{N} b_i S^i}\right]\right) = \quad (7)$$
$$C_1 V_x A_0 \left[\frac{\sum_{i=0}^{N} a_i S^i}{\sum_{i=0}^{N} b_i S^i}\right] + C_2 V_x B_0 \left[\frac{\sum_{i=0}^{N} c_i S^i}{\sum_{i=0}^{N} d_i S^i}\right]$$

As can be seen from Equation (7) additional terms in the numerator of $I_{SIG}$ will generally be present.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus having a zero-pole that is dependant on an equivalent series resistance (ESR) and a load, the apparatus comprising:
    an amplifier stage that receives a first input voltage and a bias voltage, wherein the amplifier stage has an output node, and wherein the amplifier stage includes a plurality of internal transistors;
    an intermediate stage that is coupled to the output node of the amplifier stage, wherein the intermediate stage outputs an intermediate voltage to an intermediate node;
    a first capacitor coupled between at least one of the internal transistors at an internal node and the intermediate node;
    a power transistor coupled between a second input voltage and the intermediate node;
    a second capacitor coupled between the intermediate node and the power transistor, wherein the second capacitor provides a third input voltage to the power transistor, wherein the ratio of the capacitance of the first capacitor to the capacitance of the second capacitor controls the position of the zero-pole; and
    a feedback stage coupled to the intermediate node and to the amplifier stage, wherein the feedback stage is adapted to output an output voltage to a load, and wherein the feedback stage provides a feedback voltage to the amplifier stage.

2. The apparatus of claim 1, wherein the amplifier stage further comprises a plurality of differential amplifiers.

3. The apparatus of claim 2, wherein the amplifier stage further comprises:
   a first differential amplifier that receives the first input voltage and the feedback voltage; and
   a second differential amplifier that receives a plurality of inputs from the first differential amplifier, wherein the second differential amplifier includes the internal node.

4. The apparatus of claim 1, wherein the intermediate stage further comprises:
   a PMOS transistor coupled to the bias voltage at its drain and the output node of the amplifier stage at its gate; and
   a resistor coupled between the source of the PMOS transistor and the intermediate node.

5. The apparatus of claim 1, wherein the feedback stage further comprises:
   a feedback node coupled to the amplifier stage;
   an impedance coupled between the intermediate node and the output node;
   a voltage divider coupled to the output node to the feedback node;
   a third capacitor coupled between the intermediate node and the feedback node; and
   a fourth capacitor coupled between the output node and the feedback node.

6. The apparatus of claim 1, wherein the second capacitor is about 150 fF.

7. The apparatus of claim 1, wherein the first capacitor is about 10 pF.

8. An apparatus having a zero-pole that is dependant on an ESR and a load, the apparatus comprising:
   an amplifier stage that receives a first input voltage and a bias voltage, wherein the amplifier stage includes:
      a first current source coupled to the bias voltage;
      a first FET coupled at its drain to the first current source;
      a second FET coupled at its drain to the first current source;
      a second current source coupled to the bias voltage;
      a third FET coupled to the second current source at its drain and to the source of the first transistor at its gate;
      a fourth FET coupled to the second current source at its drain and to the source of the second transistor at its gate;
      a current mirror coupled to the bias voltage; and
      a transistor coupled to the current mirror at an output node and coupled to the source of the fourth FET at an internal node;
   an intermediate stage that is coupled to the output node of the amplifier stage, wherein the intermediate stage outputs an intermediate voltage to an intermediate node;
   a first capacitor coupled between at least one of the internal transistors at an internal node and the intermediate node;
   a power transistor coupled between a second input voltage and the intermediate node;
   a second capacitor coupled between the internal node and the power transistor, wherein the second capacitor provides a third input voltage to the power transistor, wherein the ratio of the capacitance of the first capacitor to the capacitance of the second capacitor controls the position of the zero-pole; and
   a feedback stage coupled to the intermediate node and to the amplifier stage, wherein the feedback stage is adapted to output an output voltage to a load, and wherein the feedback stage provides a feedback voltage to the gate of the first FET.

9. The apparatus of claim 8, wherein the amplifier stage further comprises:
   a fifth FET coupled to the source of the third FET at its drain; and
   a sixth FET coupled to internal node at its drain, wherein the gate of the fifth FET is coupled to the gate of the sixth FET.

10. The apparatus of claim 8, wherein the intermediate stage further comprises:
    a PMOS transistor coupled to the bias voltage at its drain and the output node of the amplifier stage at its gate; and
    a resistor coupled between the source of the PMOS transistor and the intermediate node.

11. The apparatus of claim 8, wherein the feedback stage further comprises:
    a feedback node coupled to the gate of the first FET;
    an impedance coupled between the intermediate node and the output node;
    a voltage divider coupled to the output node to the feedback node;
    a third capacitor coupled between the intermediate node and the feedback node; and
    a fourth capacitor coupled between the output node and the feedback node.

12. The apparatus of claim 8, wherein the second capacitor is about 150 fF.

13. The apparatus of claim 8, wherein the first capacitor is about 10 pF.

14. An apparatus having a zero-pole that is dependant on an ESR and a load, the apparatus comprising:
    an amplifier stage that receives a first input voltage and a bias voltage, wherein the amplifier stage includes:
       a first current source coupled to the bias voltage;
       a first FET coupled at its drain to the first current source;
       a second FET coupled at its drain to the first current source;
       a second current source coupled to the bias voltage;
       a third FET coupled to the second current source at its drain and to the source of the first transistor at its gate;
       a fourth FET coupled to the second current source at its drain and to the source of the second transistor at its gate;
       a current mirror coupled to the bias voltage;
       a transistor coupled to the current mirror at an output node and coupled to the source of the fourth FET at an internal node;
       a fifth FET coupled to the source of the third FET at its drain; and
       a sixth FET coupled to internal node at its drain, wherein the gate of the fifth FET is coupled to the gate of the sixth FET;
    an intermediate stage that is coupled to the output node of the amplifier stage, wherein the intermediate stage outputs an intermediate voltage to an intermediate node;
    a first capacitor coupled between at least one of the internal transistors at an internal node and the intermediate node;
    a power transistor coupled between a second input voltage and the intermediate node;
    a second capacitor coupled between the internal node and the power transistor, wherein the second capacitor provides a third input voltage to the power transistor, wherein the ratio of the capacitance of the first capacitor to the capacitance of the second capacitor controls the position of the zero-pole; and
    a feedback stage coupled to the intermediate node and to the amplifier stage, wherein the feedback stage is adapted to output an output voltage to a load, and wherein the feedback stage includes: and
       a feedback node coupled to the gate of the first FET;

an impedance coupled between the intermediate node and the output node;

a voltage divider coupled to the output node to the feedback node;

a third capacitor coupled between the intermediate node and the feedback node; and a fourth capacitor coupled between the output node and the feedback node.

15. The apparatus of claim 14, wherein the intermediate stage further comprises:

a PMOS transistor coupled to the bias voltage at its drain and the output node of the amplifier stage at its gate; and a resistor coupled between the source of the PMOS transistor and the intermediate node.

16. The apparatus of claim 14, wherein the second capacitor is about 150 fF.

17. The apparatus of claim 14, wherein the first capacitor is about 10 pF.

* * * * *